US006831392B2

(12) United States Patent
Nariai

(10) Patent No.: US 6,831,392 B2
(45) Date of Patent: Dec. 14, 2004

(54) PIEZOELECTRIC ELEMENT DRIVING CIRCUIT AND DRIVING METHOD

(75) Inventor: Kyoichi Nariai, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/576,492

(22) Filed: May 23, 2000

(65) Prior Publication Data

US 2002/0008441 A1 Jan. 24, 2002

(30) Foreign Application Priority Data

May 24, 1999 (JP) ........................................... 11-143647

(51) Int. Cl.[7] ............................................... H01L 41/08

(52) U.S. Cl. ................................................. 310/316.01

(58) Field of Search ....................... 310/316.01, 316.02, 310/317, 319; 347/19, 11

(56) References Cited

U.S. PATENT DOCUMENTS

| | | | | |
|---|---|---|---|---|
| 5,096,316 A | * | 3/1992 | Otsuka et al. | 400/692 |
| 5,387,834 A | * | 2/1995 | Suzuki | 310/317 |
| 5,834,871 A | * | 11/1998 | Puskas | 310/316.02 |
| 6,039,428 A | * | 3/2000 | Juve | 347/19 |

FOREIGN PATENT DOCUMENTS

| | | | | |
|---|---|---|---|---|
| JP | 63-071705 | | 4/1988 | |
| JP | 04316851 | * | 4/1991 | B41J/2/045 |
| JP | 05169686 | * | 5/1992 | B41J/2/30 |
| JP | 04316851 A | | 9/1992 | |
| JP | 4-290585 | | 10/1992 | |
| JP | 05169686 A | | 9/1993 | |
| JP | 06000959 A | | 11/1994 | |
| JP | 8-177678 | | 7/1996 | |
| JP | 10193587 A | | 7/1998 | |

* cited by examiner

*Primary Examiner*—Burton S. Mullins
*Assistant Examiner*—Karen Addison
(74) *Attorney, Agent, or Firm*—Morgan, Lewis & Bockius

(57) ABSTRACT

A piezoelectric element driving circuit for driving a plurality of piezoelectric elements disposed in a plurality of head units is disclosed, that comprises a plurality of power amplifiers for driving the plurality of head units, a plurality of flexible flat cables for connecting the plurality of head units and the plurality of power amplifiers, and a drive waveform signal generating circuit for supplying a drive waveform signal to the plurality of head units, wherein each of the plurality of head units has a switch device for supplying a piezoelectric element current to the plurality of piezoelectric elements, wherein the plurality of power amplifiers are disposed corresponding to the plurality of head units, the plurality of power amplifiers supplying a drive waveform signal that is input from the drive waveform signal generating circuit to the plurality of power amplifiers so as to drive the plurality of head units.

3 Claims, 9 Drawing Sheets

PIEZOELECTRIC ELEMENT DRIVING CIRCUIT AND DRIVING METHOD

BACKGROUND OF THE INVENTION

1. Field of the Invention

The present invention relates to a piezoelectric element driving apparatus for driving a plurality of piezoelectric elements that use the piezoelectric effect, in particular, to a piezoelectric element driving apparatus applicable to small printer heads for use with an ink jet printer or the like.

2. Description of the Related Art

In recent years, ink jet printers have been commercially available. Each ink jet printer has ink nozzles from which ink droplets are sprayed to a sheet of paper so as to print characters and images thereon. The ink jet printer uses heating elements and piezoelectric elements that produce the ink droplets and spray them on a sheet of paper. As the piezoelectric elements vibrate, the ink droplets are sprayed. Conventionally, to prevent the printer nozzle from being clogged with ink, piezoelectric nozzles are multi-layered and the spraying of ink droplets is controlled.

The heads of the piezoelectric element driving type ink jet printers use electro-strictness of which mechanical distortion takes place with a crystal such as Rochelle salt or barium titanium in an electric field using piezoelectric effect wherein the dielectric value of a crystal varies as a function of an electric charge on the surface thereof corresponding to an applied mechanical distortion. Using the characteristic that a piezoelectric element is deformed with a voltage, ink droplets are sprayed from nozzles of heads. Since the slope of the voltage and the potential are proportional to the acceleration and the intensity of the deformation of the piezoelectric element, by controlling them, the velocity and diameter of the ink droplets can be varied. Thus, to accurately control the acceleration and size of sprayed ink droplets, it is necessary to properly apply a voltage to the piezoelectric element. to the acceleration and the intensity of the deformation of the piezoelectric element, by controlling them, the velocity and diameter of the ink droplets can be varied. Thus, to accurately control the acceleration and size of sprayed ink droplets, it is necessary to properly apply a voltage to the piezoelectric element.

FIG. 1 shows the structure of a piezoelectric element. Referring to FIG. 1, the piezoelectric element 10 is structured in a rectangular shape. The piezoelectric element 10 has piezoelectric lamination portions 13 and electrodes 11 that are alternately formed. By applying an electric field between the electrodes 11, a vertical mechanical distortion takes place. By applying the mechanical distortion to an ink reservoir of a side 12 disposed adjacent to the electrodes 11, ink droplets are sprayed from the nozzle of the ink reservoir.

When full colors are printed, a plurality of nozzles corresponding to a plurality of ink reservoirs for cyan ink, magenta ink, yellow ink, and black ink are used.

FIG. 2 is a schematic diagram showing the structure of a printer apparatus including a printer head peripheral portion using piezoelectric elements 10. The printer apparatus comprises ink reservoirs 23, a carrier 22, a SP (spacing) motor 26, a shaft 24, an LF (line field) motor 25, a platen 28, and a flat flexible cable (FFC) 27. The carrier 22 moves heads (not shown) in the main scanning direction. The SP motor 26 drives the carrier 22. The shaft 24 is used to move the carrier 22. The LF motor 25 feeds paper 21 in the sub-scanning direction. The FFC 27 bends as the carrier 22 travels.

In the structure shown in FIG. 2, the paper 21 is fed in the sub-scanning direction by the LF motor 25, the platen 28, a feed roller (not shown), and so forth. The carrier 22 is moved along the shaft 24 by the SP motor 26. A drive signal and a control signal are supplied to the heads through the FFC 27 so that ink droplets are sprayed to the paper 21 at a predetermined timing.

In the carrier 22, the ink reservoirs 23 and the heads are connected with respective tubes (not shown). Inks in the ink reservoirs 23 are supplied to the heads. When the piezoelectric elements 10 are driven, they are deformed. Thus, the heads are partly stressed and thereby ink in the heads are partly sprayed from the nozzles. Consequently, an image is formed on the paper 21.

In a conventional piezoelectric element driving circuit, when a drive waveform signal amplified by a power amplifier is sent to a piezoelectric element 10, an RC filter is formed by a total of the resistance of an FFC as a transmission path and the static capacitance of the piezoelectric element. Thus, since a high frequency component of the drive waveform signal is lost, the drive waveform signal cannot be transmitted to the piezoelectric element 10 that requires it.

In particular, as the number of piezoelectric elements becomes large, the capacitance component C of the time constant RC of which the resistance component R and the capacitance component C are multiplied becomes large. Thus, since the time constant ô=RC becomes large, only lower frequency components are transmitted to the piezoelectric elements. Consequently, the piezoelectric effect of the piezoelectric elements that should be driven at high speed is deteriorated. For example, when the piezoelectric elements are used for an ink jet printer, the velocity and size of ink droplets sprayed from the heads cannot be accurately controlled. Thus, the print quality of a print image is deteriorated.

Next, with reference to FIG. 3, a piezoelectric element driving circuit for use with a conventional printer apparatus will be described. The piezoelectric element driving circuit shown in FIG. 3 comprises a drive waveform signal generating circuit 1, a power amplifier 2, a flexible flat cable (FFC) 3, a plurality of head units 4, a plurality of switch devices 5, and a plurality of piezoelectric elements 6. The drive waveform signal generating circuit 1 generates a drive waveform signal for driving a plurality of piezoelectric elements 6. The power amplifier 2 amplifies the drive waveform signal. The FFC 3 connects the power amplifier 2 and the head units 4. The switch devices 5 are disposed in the head units 4. The piezoelectric elements 6 are connected to the switch device 5 of each of the head units 4. The head units 4 are color head units for cyan c, magenta m, yellow y, and black b. Each of the head units 4 has, for example, 32 nozzles. Each piezoelectric element 6 can be represented as a capacitance on an equivalent circuit diagram. Thus, corresponding to 32 nozzles of each color head unit, there is a capacitance of 32 capacitors. By turning on/off switches of each switch device 5 through a controlling circuit (not shown), required piezoelectric elements are driven. In this example, it is assumed that the capacitance of one piezoelectric element 6 is 1 nF.

Next, with reference to FIGS. 4A, 4B, and 4C, the relation of an input waveform signal and an output waveform signal of a conventional piezoelectric element driving circuit will be described.

FIG. 4A shows an output waveform signal of a piezoelectric element driving power amplifier. The output waveform signal of the piezoelectric element driving power amplifier becomes an input waveform signal of an RC filter composed of a resistance component R of an FFC and the capacitance component C of piezoelectric elements.

FIG. 4B shows an output waveform signal in the case that the waveform signal shown in FIG. 4A is input to a load of R=1 ohm and C=10 nF. As is clear from FIG. 4B, the capacitance C of the piezoelectric elements as the load is small, the time content ô=RC=10 nsec, and the output waveform signal is almost the same as the input waveform signal.

FIG. 4C shows an output waveform signal in the case that the waveform signal shown in FIG. 4A is input to a load of which R=1 ohm and C=10×32×4 colors=1280 nF.

As described above, since the value of the time constant ô=RC is large (namely. ô=RC=1.28 isec), the output waveform signal is largely different from the input waveform signal.

As a related art reference for solving such a problem, Hiroyuki Masunaga has disclosed a piezoelectric element driving circuit as Japanese Patent Laid-Open Publication No. 4-290585. According to the related art reference, a resistor module having a plurality of resistors connected in parallel is disposed. An on/off control signal for driving piezoelectric vibrators is input to the resistor module. An analog switch circuit selects one of resistors from the resistor module corresponding to a selection signal. A signal that passes through the selected resistor is compared with a reference voltage by an operational amplifier circuit. A voltage proportional to the difference is applied to the piezoelectric vibrators. Thus, the deviation of the characteristics of the individual piezoelectric vibrators is adjusted.

However, according to the related art reference, countermeasures against the deterioration of the time constant due to the equivalent capacitance of a plurality of piezoelectric elements have not been disclosed at all. If the piezoelectric elements have individual driving circuits, the time constant does not become large. However, in this case, the size and cost of the circuit become large. In particular, it is necessary for the print heads of the ink jet printer to successively apply impulses to a plurality of laminated piezoelectric elements and simultaneously spray a plurality of streams of ink droplets to a sheet of paper. Thus, when the time constant of the piezoelectric element driving circuit becomes large, the steams of ink droplets that are sprayed delay. Consequently, the print quality of the printer deteriorates and the load of the driving circuit becomes large.

SUMMARY OF THE INVENTION

An object of the present invention is to provide a driving circuit for directly driving an applied pulse waveform signal without an increase of the time constant of a plurality of piezoelectric elements that are driven.

A first aspect of the present invention is a piezoelectric element driving circuit for driving a plurality of piezoelectric elements disposed in a plurality of head units, comprising a plurality of power amplifiers for driving the plurality of head units, a plurality of flexible flat cables for connecting the plurality of head units and the plurality of power amplifiers, and a drive waveform signal generating circuit for supplying a drive waveform signal to the plurality of head units through said plurality of power amplifiers, wherein each of the plurality of head units has a switch device for supplying a piezoelectric element current to the plurality of piezoelectric elements, wherein the plurality of power amplifiers are disposed corresponding to the plurality of head units, the plurality of power amplifiers supplying a drive waveform signal that is input from the drive waveform signal generating circuit to the plurality of power amplifiers so as to drive the plurality of head units.

A second aspect of the present invention is a piezoelectric element driving method for driving a plurality of piezoelectric elements disposed in a plurality of head units, each of which has a plurality of power amplifiers for driving the plurality of head units, a plurality of flexible flat cables for connecting the plurality of head units and the plurality of power amplifiers, and a drive waveform signal generating circuit for supplying a drive waveform signal to the plurality of head units, the method comprising the steps of driving the plurality of power amplifiers so as to amplify the drive waveform signal, and causing the plurality of head units to spray large ink droplets, middle ink droplets, or small ink droplets corresponding to the drive waveform signal that is output from the drive waveform signal generating circuit, wherein when the small ink droplets are sprayed, the time constant of the plurality of power amplifiers that are driven allows the number of piezoelectric elements that are simultaneously driven becomes the maximum.

A third aspect of the present invention is a piezoelectric element driving system, used in a printer apparatus, for driving a plurality of piezoelectric elements disposed in a plurality of head units, comprising a plurality of power amplifiers driven for the respective head units, a plurality of flexible flat cables for connecting the plurality of head units and the plurality of power amplifiers, a drive waveform signal generating circuit for supplying a drive waveform signal to the plurality of power amplifiers, print paper to which ink is sprayed from the plurality of head units driven by the plurality of power amplifiers so as to print characters and so forth on the print paper, a mechanical portion for driving the print paper in a sub-scanning direction and traveling the head units in a main scanning direction, wherein the head units spray large ink droplets, middle ink droplets, and small ink droplets driven by the plurality of power amplifiers that amplify the drive waveform signal.

A fourth aspect of the present invention is a piezoelectric element driving circuit for driving a plurality of piezoelectric elements disposed in a plurality of head units, comprising a plurality of power amplifiers for driving the plurality of piezoelectric elements disposed in the plurality of head units, a plurality of first switch devices, disposed corresponding to the plurality of power amplifiers, having a plurality of connection/disconnection switches whose input side is short-circuited, a plurality of flexible cables connected to the connection/disconnection switches of the plurality of first switch devices, and a plurality of second switch devices, disposed corresponding to the plurality of head units, having a plurality of connection/disconnection switches whose input side is connected to the plurality of flexible cables and whose output side is short-circuited and connected to the plurality of head units, wherein the output side of the connection/disconnection switches of the plurality of first switch devices and the input side of the connection/disconnection switches of the plurality of second switch devices are paired and connected, wherein the connection/disconnection of the connection/disconnection switches of the plurality of first switch devices and the plurality of second switch devices is controlled corresponding to the number of piezoelectric elements to be driven so as to decrease the time constant of the plurality of power amplifiers to a predetermined value or less.

In the above-mentioned circuits, driving method, and so forth, the waveform signal generated by the waveform signal generating circuit is amplified by the plurality of power amplifiers. The amplifiers are connected to respective head units. Thus, the load driven by each power amplifier is suppressed. Thus, the distortion of the drive waveform signal against the variation of the load is suppressed.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described.

First Embodiment (1) Structure of First Embodiment

Figure 1:
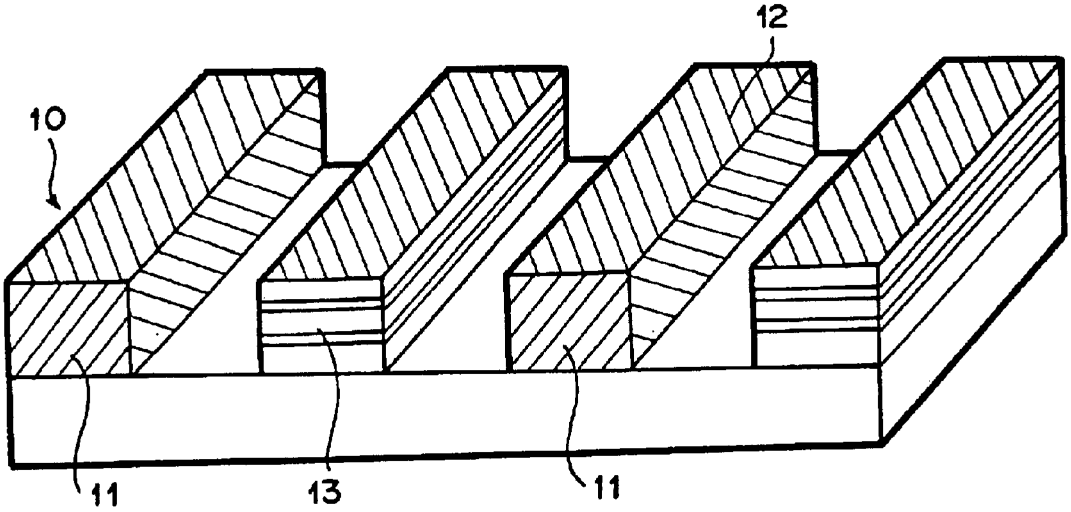
FIG. 1 PRIOR ART
FIG. 1 is a perspective view showing an outlined structure of a piezoelectric element.
Figure 2:
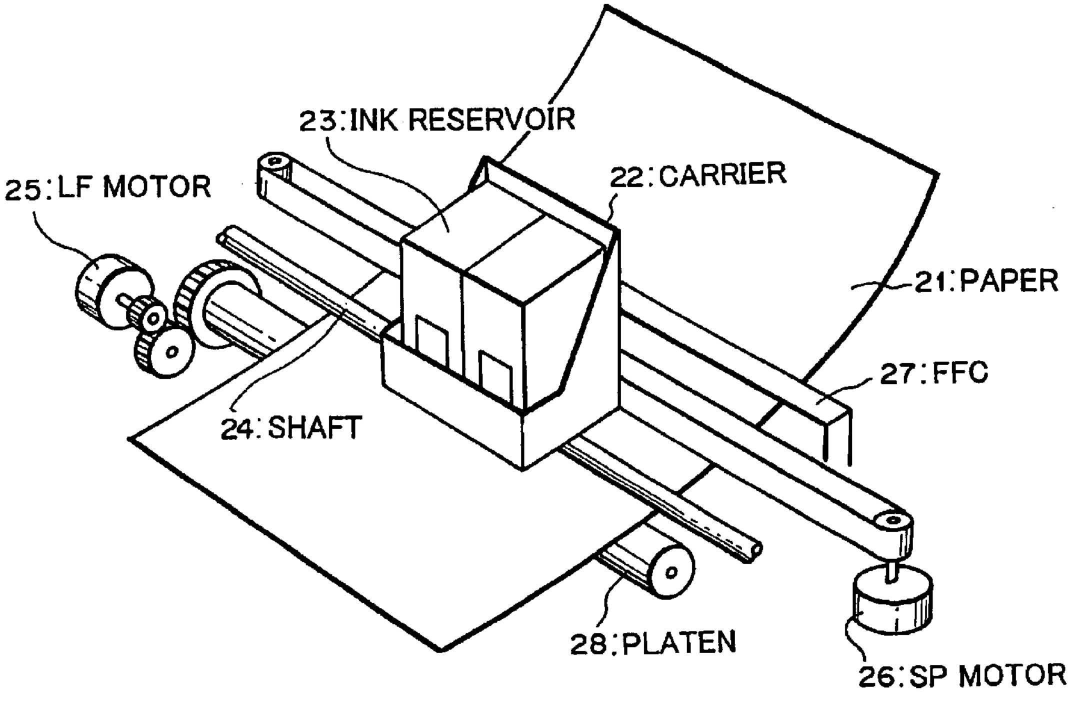
FIG.2 PRIOR ART
FIG. 2 is a perspective view showing the structure of a print header portion of a printer apparatus.
Figures 3, 4A, 4B, 4C:
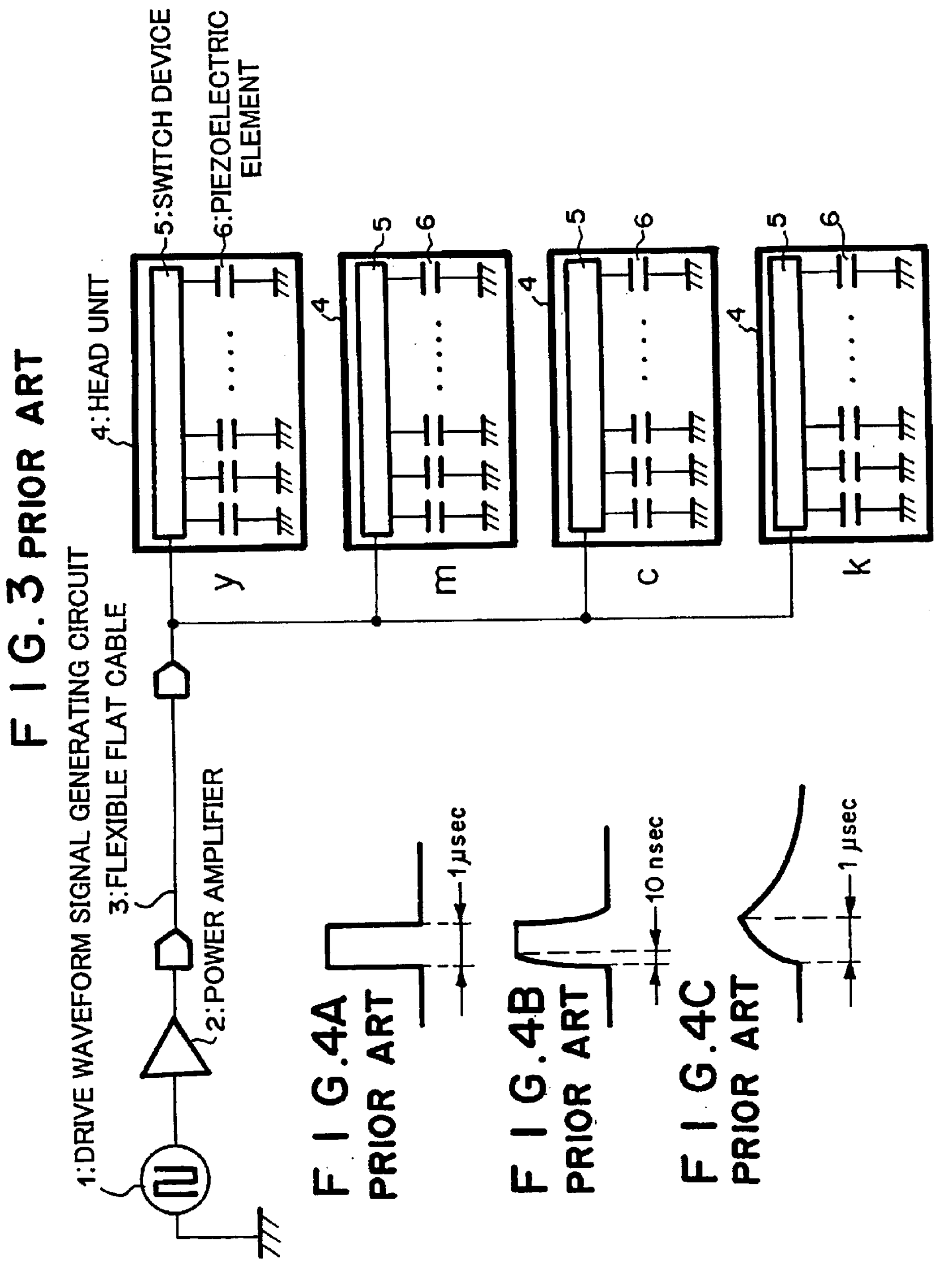
FIG. 3 PRIOR ART
FIG. 4A PRIOR ART
FIG. 4B PRIOR ART
FIG. 4C PRIOR ART
FIG. 3 is a schematic diagram showing a block diagram of a conventional piezoelectric element driving circuit.
FIGS. 4A to 4C are schematic diagrams showing waveform signals of a conventional piezoelectric element driving circuit.
Figure 5:
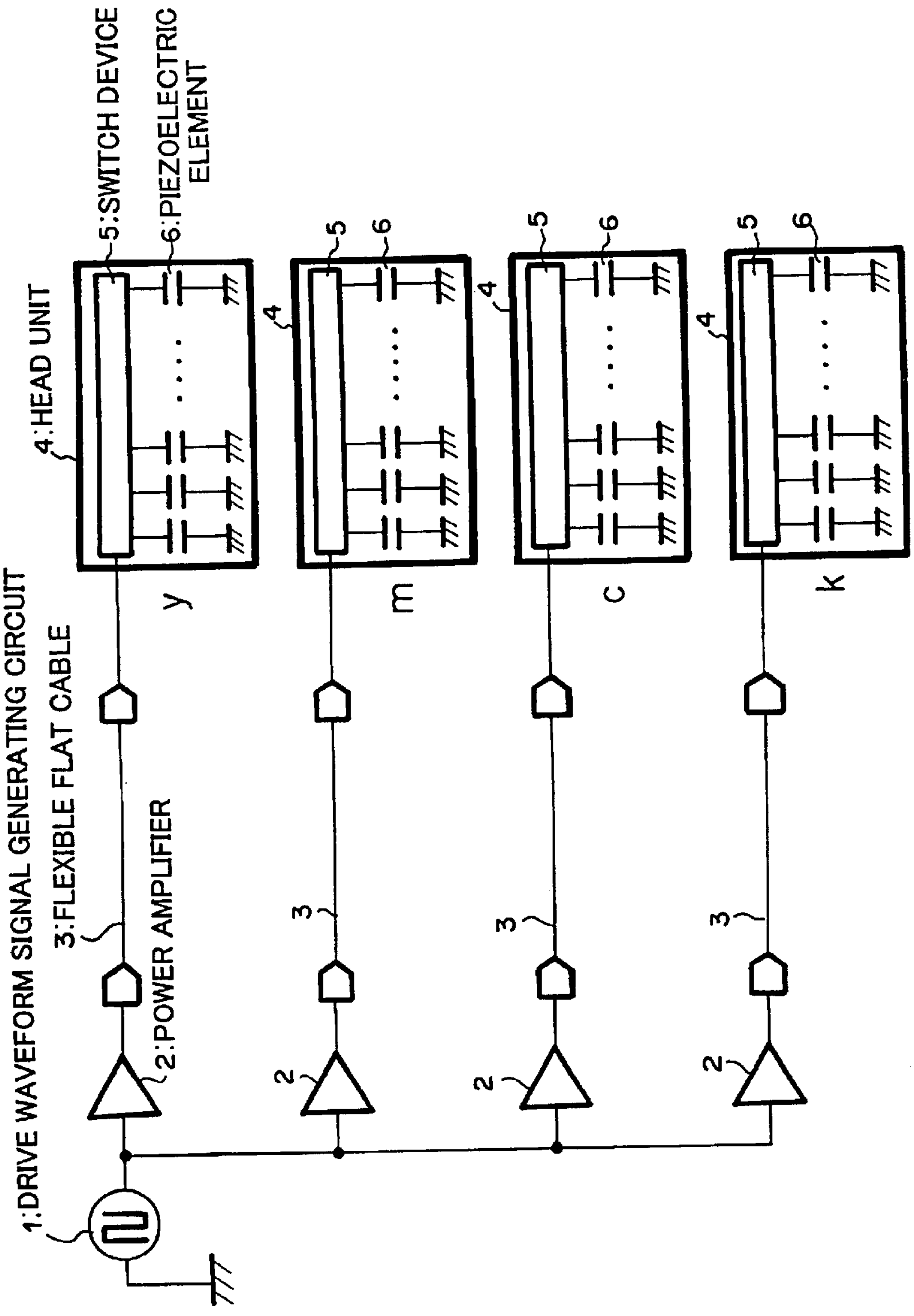
FIG. 5 is a block diagram showing the structure of a piezoelectric driving circuit according to a first embodiment of the present invention.

With reference to FIG. 5, the structure of a piezoelectric element driving circuit according to the first embodiment of the present invention will be described. In FIG. 5, reference numeral 1 is a drive waveform signal generating circuit that generates a drive waveform signal for driving a plurality of piezoelectric elements. Reference numeral 2 is a power amplifier that amplifies the drive waveform signal. There are a plurality of power amplifiers 2. Reference numeral 3 is a flexible flat cable (FFC). There are a plurality of FFC 3. Reference numeral 4 is a head unit. There are a plurality of head units 4. The FFCs 3 connects the power amplifiers 2 and the respective head units 4 through respective connectors. Reference numeral 5 is a switch device disposed in each of the head units 4. Reference numeral 6 is a piezoelectric element.

There are a plurality of piezoelectric elements 6. The piezoelectric elements 6 are connected to the switch device 5 of each of the head units 4.

Figure 6:
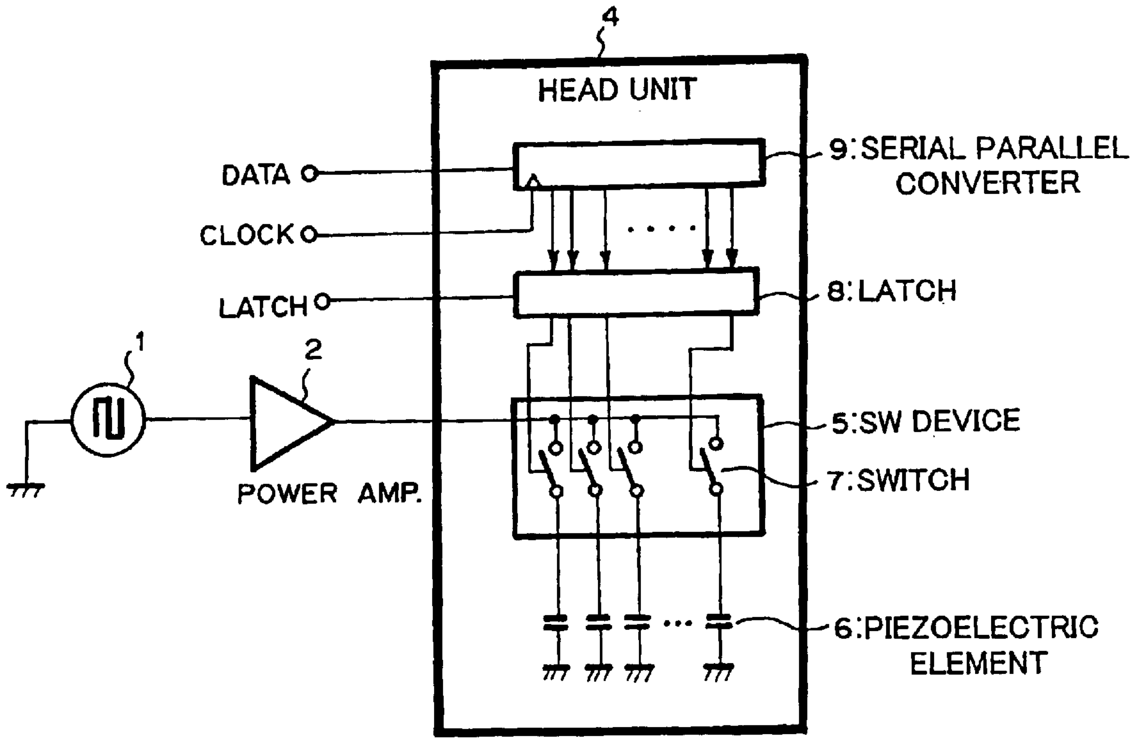
FIG. 6 is a block diagram showing the structure of a head unit of the piezoelectric element driving circuit according to the first embodiment of the present invention.

FIG. 6 shows the detailed structure of each head unit 4. A drive waveform signal is sent to piezoelectric elements 6 through individual switches 7 of a switch device 5.

The switch device 5 has a switch controlling circuit that controls the connection/disconnection of the switches 7. The switches 7 are for example semiconductor switches. The head unit 4 receives data, a clock signal, a latch signal, and so forth through an FFC 3. A serial/parallel converter 9 converts a serial signal into a parallel signal corresponding to the clock signal. A latch circuit 8 temporarily latches the parallel signal. The switches 7 are turned on/off corresponding to the parallel signal. Corresponding to an output signal of the power amplifier 2, the piezoelectric elements 6 are driven through the switches 7. In reality, the power amplifier 2 outputs drive waveform signals for large droplets, middle droplets, and small droplets. According to the first embodiment of the present invention, each head unit has 32 piezoelectric elements 6. Thus, the maximum number of piezoelectric elements 6 that the power amplifier 2 can drive is 32.

In other words, the number of piezoelectric elements 6 of one head unit 4 connected to one power amplifier 2 is restricted so that the total amount of the static capacitance of the piezoelectric elements 6 does not become large.

(2) Operation of First Embodiment

Next, the operation of the circuit shown in FIG. 5 will be described. As shown in FIG. 5, one power amplifier 2 is connected to one head unit 4.

For example, 32 piezoelectric elements are connected to one head unit 4. The 32 piezoelectric elements are connected to one power amplifier 2 through the switch device 5 and the FFC 3.

In the circuit shown in FIG. 5, there are for head units 4. Each head unit 4 is connected to one power amplifier 2.

First of all, the case that one piezoelectric element 6 of one head unit 4 is driven is considered. In this case, one switch 6 of the switch device 5 connected to the piezoelectric element 6 is turned on. Thus, the piezoelectric element 6 is connected to the power amplifier 2 through the FFC 3.

In this case, the static capacitance of the piezoelectric element 6 is connected to the power amplifier 2 through the line resistance of the FFC 3.

Figure 7:
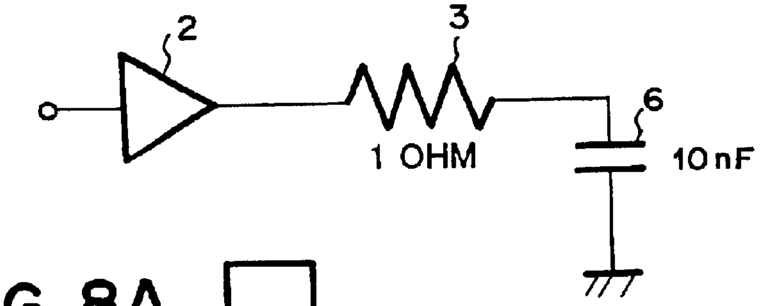
FIG. 7 is an equivalent circuit diagram showing the structure of a part of the piezoelectric element driving circuit according to the first embodiment of the present invention.

FIG. 7 shows an equivalent circuit of which the static capacitance of one piezoelectric element 6 is 10 nF and the line resistance of the FFC 3 is 1 ohm.

Figure 8A:
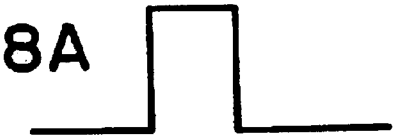
FIGS. 8A and 8B are schematic diagrams showing waveform signals of the piezoelectric element driving circuit according to the first embodiment of the present invention.
Figure 8B:
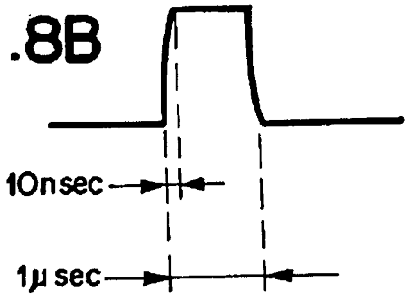

At this point, the time constant of the load circuit that drives the power amplifier 2 becomes ô=RC=1 ohm×10 nF=10 nsec. When a drive waveform signal shown in FIG. 8A is output from the power amplifier 2, a waveform signal shown in FIG. 8B is input to the piezoelectric element 6.

Figure 9:
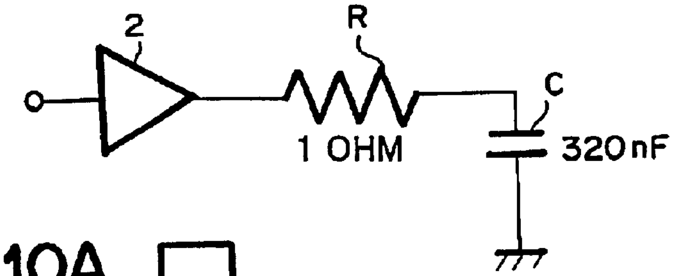
FIG. 9 is an equivalent circuit diagram showing the structure of a part of the piezoelectric element driving circuit according to the first embodiment of the present invention.

Next, the case that all the piezoelectric elements 6 of the four head units 4 are driven is considered. Since one head unit 4 is connected to one power amplifier 2 and the number of piezoelectric elements driven by one power amplifier 2 is 32, the equivalent static capacitance becomes 32×10 nF=320 nF. At this point, the time constant becomes ô=RC=1 ohm×320 nF=320 nsec. FIG. 9 shows an equivalent circuit of which the series resistance R on the output side of the power amplifier 2 is 1 ohm and the capacitance C of all the piezoelectric elements 6 is 320 nF.

Figure 10A:
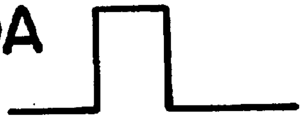
FIGS. 10A and 10B are schematic diagrams showing waveform signals of the piezoelectric element driving circuit according to the first embodiment of the present invention.
Figure 10B:
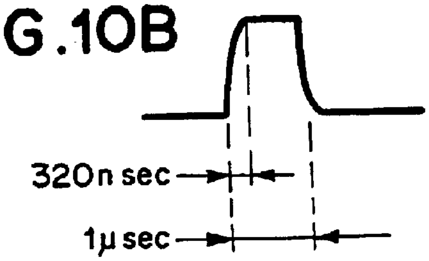

When a drive waveform signal shown in FIG. 10A is output from the power amplifier 2, a waveform signal shown in FIG. 10B is input to the piezoelectric element 6. Regardless of whether the number of piezoelectric elements 6 as a load is 1 or 32, the drive waveform signal that is input to the piezoelectric elements 6 does not largely vary. Thus, the print quality of an image printed on paper does not deteriorate.

Figure 11A:
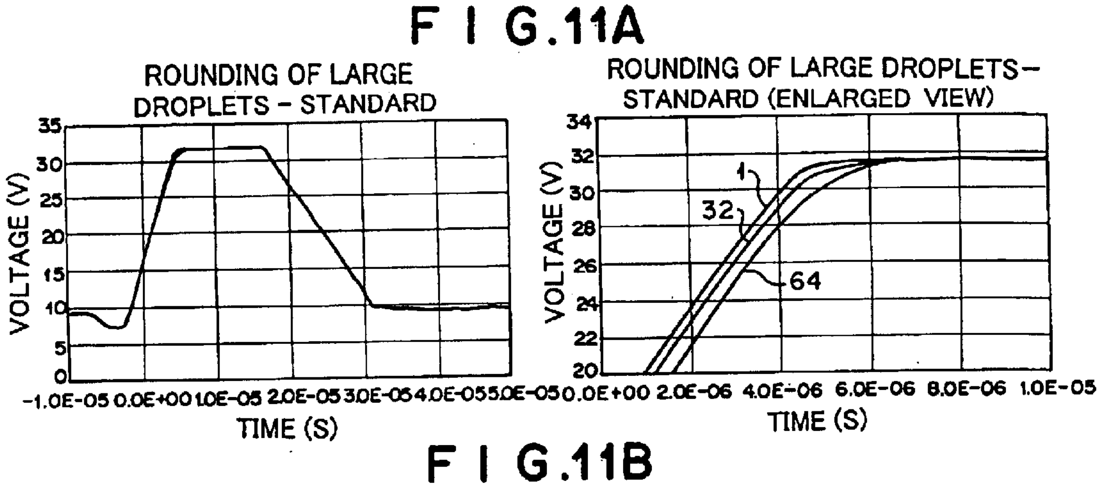
FIGS. 11A to 11C are graphs showing waveform signals of the piezoelectric element driving circuit according to the first embodiment of the present invention.
Figure 11B:
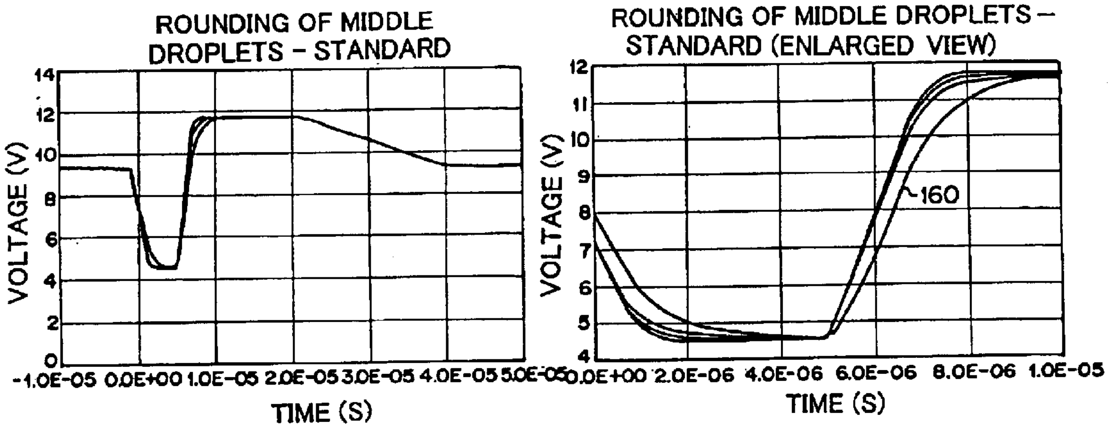
Figure 11C:
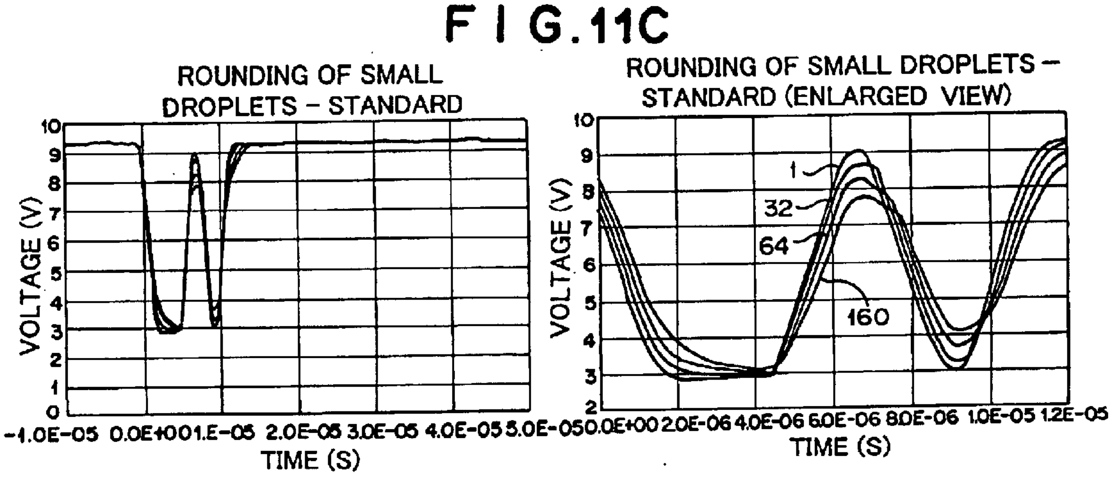

FIGS. 11A to 11C show drive waveform signals. In FIG. 11A, the horizontal axis and the vertical axis represent time and input voltage of the head unit, respectively. FIG. 11A shows the rounding of a drive waveform signal for spraying large droplets in the case that the number of nozzles that are simultaneously driven is 1, 32, and 64. The right side of FIG. 11A is a partially enlarged view of the graph.

FIG. 11B shows the rounding of a drive waveform signal for spraying middle droplets in the cases that the number of nozzles that are simultaneously driven is 1, 32, 64, and 160.

FIG. 11C shows the rounding of a drive waveform signal for spraying small droplets in the cases that the number of nozzles that are simultaneously driven is 1, 32, 64, and 160.

FIGS. 11A, 11B, and 11C show that since the drive waveform signal for spraying small droplets most sharply vary in a short time, the rounding of the drive waveform signal due to the time constant is the largest.

To obtain the drive waveform signals as shown in FIGS. 11A, 11B, and 11C, it is necessary to decrease the time constant. In particular, as shown in the partially enlarged views on the right side of each graph, as the number of nozzles increases, the rounding of each drive waveform becomes large. The effect of the present invention is applied to the rounding of the drive waveform signals.

Thus, when ink is sprayed to print paper in the order of large droplets, middle drop lets, and small droplets, the time constant should be selected in such a manner that when small droplets are sprayed the maximum number of piezoelectric elements 6 of the head unit 4 are driven. Thus, it is clear that the time constant is selected for small droplets. As long as the time constant is smaller than 400 nsec, the image quality of an image printed on print paper does not deteriorate.

Due to the relation between the number of nozzles to be driven and the velocity of droplets, the velocity of large droplets against the number of nozzles to be driven in the case that the number of nozzles is around 300 is around 80% of that in the case that the number of nozzles is one. The velocity of middle droplets against the number of nozzles to be driven in the case that the number of nozzles is around 300 is 50% or less of that in the case that the number of nozzles is one. In particular, the velocity of small droplets against the number of nozzles to be driven in the case that the number of nozzles is around 300 is 30% or less of that in the case that the number of nozzles is one. Thus, 100 or more nozzles cannot be driven. Consequently, it is clear that the velocity of droplets largely depends on the rounding of the drive waveform signal as well as the characteristics of the head, the drive waveform signal, the material of ink, and viscosity of ink, and so forth. To supply accurate drive waveform signals according to the present invention (namely, to increase the number of nozzles and maintain the print quality), the time constant of the drive system and the drive amplitude waveforms are very important.

Second Embodiment

Figure 12:
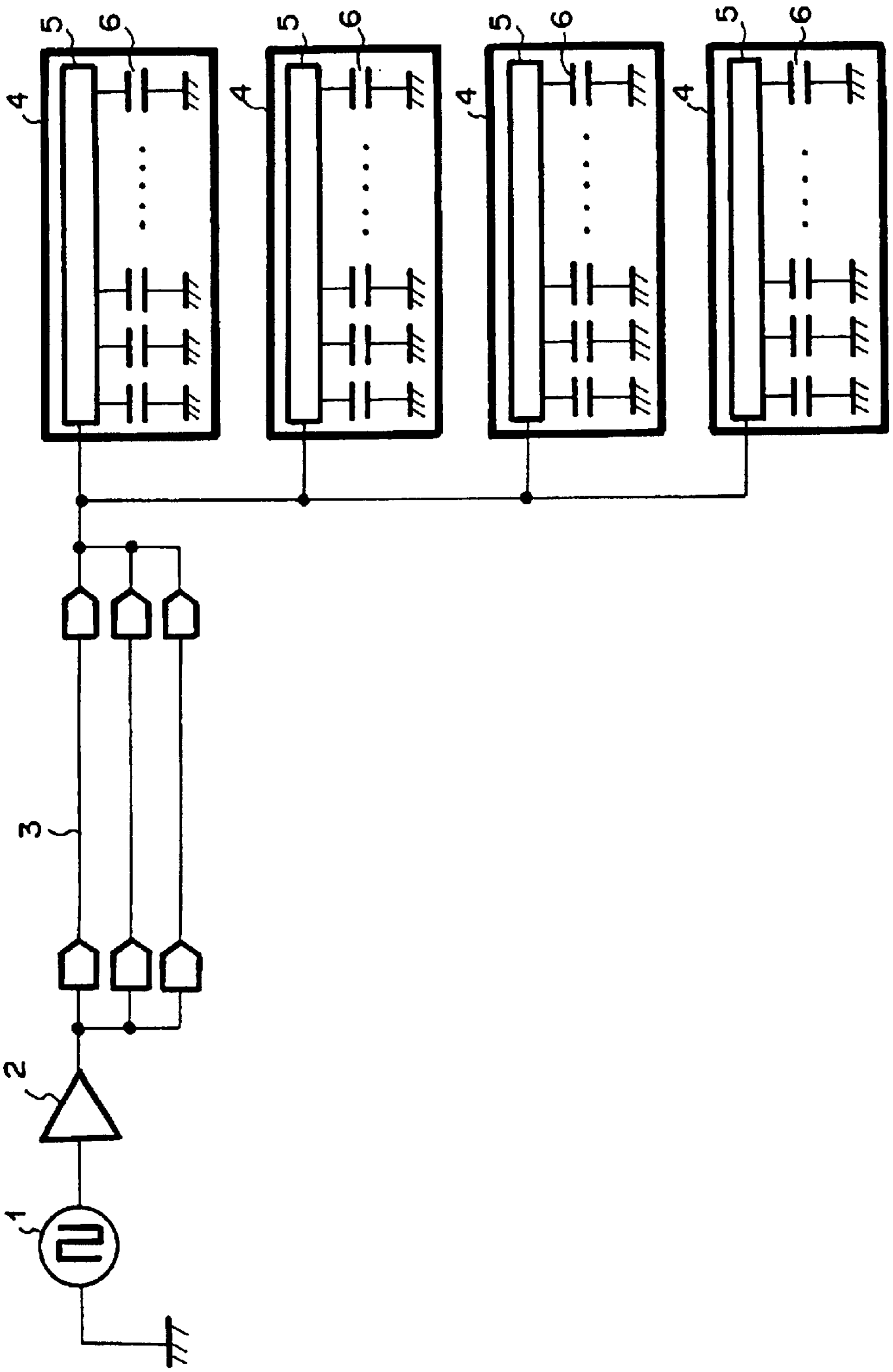
FIG. 12 is a block diagram showing the structure of a piezoelectric driving circuit according to a second embodiment of the present invention.

Next, a second embodiment of the present invention will be described. As shown in FIG. 12, a drive waveform signal that is output from a power amplifier 2 is sent to piezoelectric elements 6 through FFCs 3. Thus, when the time constant ô=RC of the transmission path is small, the distortion of the drive waveform signal sent to the piezoelectric elements 6 becomes small.

According to the first embodiment, a plurality of power amplifiers 2 is used so as to decrease the capacitance C of the piezoelectric elements. However, it is clear that the same effect is obtained by decreasing the resistance R.

As shown in FIG. 12, by increasing the pattern width of the FFC 3, resistance components are connected in parallel. Thus, the resistance components of the FFC 3 can be decreased. In this case, three FFCs 3 are connected in parallel. Alternatively, the line width of one FFC 3 is increased three times.

Third Embodiment

Figure 13:
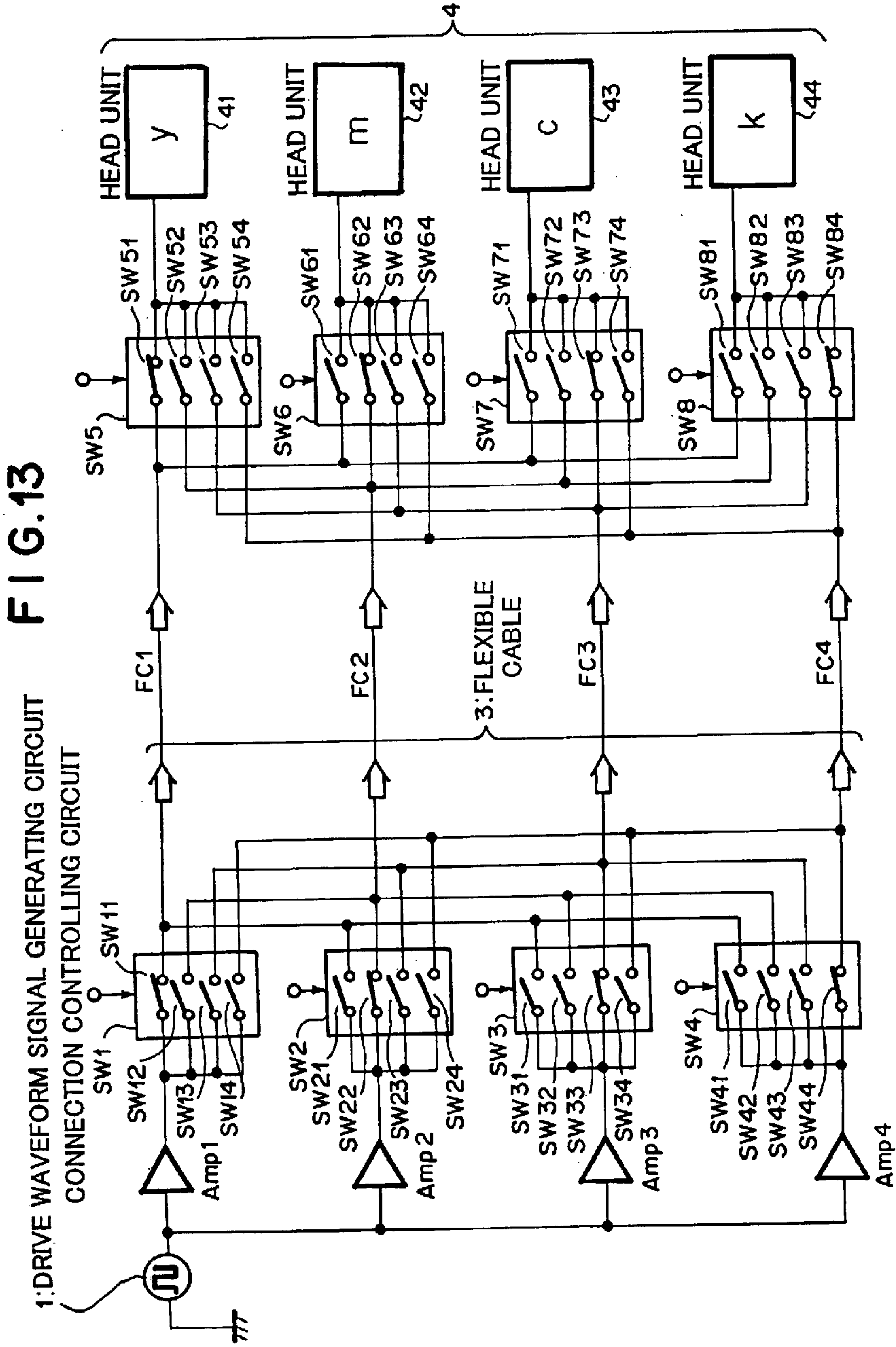
FIG. 13 is a schematic diagram showing the structure of a piezoelectric driving circuit according to a third embodiment of the present invention.

Next, a third embodiment of the present invention will be described. FIG. 13 is a block diagram showing the structure of a piezoelectric element driving circuit according to the third embodiment of the present invention. A head unit 4 slides. The head unit 4 is an integrated head unit having a yellow head unit 41, a magenta head unit 42, a cyan head unit 43, and a black head unit 44. The yellow head unit 41 has 32 piezoelectric elements and sprays yellow ink. The magenta head unit 42 has 32 piezoelectric elements and sprays magenta ink. The cyan head unit 43 has 32 piezoelectric elements and sprays cyan ink. The black head unit 44 has 32 piezoelectric elements and sprays black Ink.

A power amplifier 1, a switch device SW1, a copper foil FC1, and a switch device SW5 are connected in series. The power amplifier 1 drives piezoelectric elements of the yellow head unit 41. The switch device SW1 selects a switch corresponding to the number of piezoelectric elements to be driven. The copper foil FC1 is one cable part of the flexible cable 3 connected to the yellow head unit 41. The switch device SW5 selects a switch corresponding to the number of piezoelectric elements. Likewise, piezoelectric elements of the magenta head unit 42 are driven by a power amplifier 2, a switch device SW2, a copper foil FC2, and a switch device SW6. Piezoelectric elements of the cyan head unit 43 are driven by a power amplifier 3, a switch device SW3, a copper foil FC3, and a switch device 7. Piezoelectric elements of the black head unit 44 are driven by a power amplifier 4, a switch device SW4, a copper foil 4, and a switch device SW8.

The switch devices SW1 to SW8 each have four switches. Switches SW11, SW21, SW31, and SW41 of the switch devices SW1 to SW4 are short-circuited on the output side thereof. Likewise, switches SW12, SW22, SW32, and SW42 of the switch devices SW1 to SW4 are short-circuited on the output side, thereof. Likewise, switches SW13, SW23, SW33, and SW34 of the switch devices SW1 to SW4 are short-circuited on the output side thereof. Likewise, switches SW14, SW24, SW34, and SW44 of the switch devices SW1 to SW4 are short-circuited on the output side thereof. Switches SW51, SW61, SW71, and SW81 of the switch devices SW5 to SW8 are short-circuited on the input side thereof. Likewise, switches SW52, SW62, SW72, and SW82 of the switch devices SW5 to SW8 are short-circuited on the input side thereof. Likewise, switches SW53, SW63, SW73, and SW83 of the switch devices SW5 to SW8 are short-circuited on the input side thereof. Likewise, switches SW54, SW64, SW74, and SW84 of the switch devices SW5 to SW8 are short-circuited on the input side thereof. In addition, the switches of each of the switch devices SW1 to SW4 are short-circuited on the input side thereof. The switches of each of the switch devices SW5 to SW8 are short-circuited on the output side thereof. A connection controlling circuit (not shown) controls the connection/disconnection of each switch of the switch devices SW1 to SW8. Thus, corresponding to a control signal that is output from the connection controlling circuit, the connection/disconnection of each of the switches SW11 to SW14 of the switch device SW1 is controlled.

In the above-described piezoelectric element driving circuit, when all piezoelectric elements of all the yellow head unit, the magenta head unit, the cyan head unit, and the black head unit are driven, the switch SW11 of the switch device SW1 and the switch SW5 of the switch device SW5 are turned on. In addition, the switch SW22 of the switch device SW2 and the switch SW62 of the switch device SW6 are turned on. The switch SW33 of the switch device SW3 and the switch SW73 of the switch device SW7 are turned on. The switch SW44 of the switch device SW4 and the switch SW84 of the switch device SW8 are turned on. Thus, an output signal of the power amplifier 1 is directly input to the yellow head unit 41. An output signal of the power amplifier 2 is directly input to the magenta head unit 42. An output signal of the power amplifier 3 is directly input to the cyan head unit 43. An output signal of the power amplifier 4 is directly input to the black head unit 44.

When only 32 piezoelectric elements of the yellow head unit 41 are simultaneously driven, the switches SW11, SW12, SW13, and SW14 of the switch device SW1 and the switches SW51, SW52, SW53, and SW54 of the switch device SW5 are turned on. On the other hand, the switches of the other switch devices SW2 to SW4 and SW6 to SW8 are turned off. Thus, the output signal of the power amplifier 1 is input to the yellow head unit 41 through the switch device SW1, the flexible cable FC1 to FC4, and the switch device SW5. At this point, the time constant of the resistance component R of the flexible cable FC1 to FC4 that are connected in parallel and the capacitance component C of the piezoelectric elements that are simultaneously driven is ¼ as small as that of the flexible cable FC1. Thus, the leading edges of the drive pulses that are output from the power amplifier for the piezoelectric elements become sharp. Consequently, the print quality of an image can be maintained or improved.

When 16 piezoelectric elements of the yellow head unit 41 and 16 piezoelectric elements of the magenta head unit 42 are simultaneously driven, the switches SW11 and SW13 of the switch device SW1 and the switches SW51 and SW53 of the switch SW5 are turned on. In addition, the switches SW22 and SW24 of the switch device SW2 and the switches SW62 and SW64 of the switch device SW6 are turned on. In addition, all the switches of the switch devices SW3, SW4. SW7, and SW8 are turned off. Thus, the output signal of the power amplifier 1 is input to the yellow head unit 41 through the switch device SW1, the flexible cable FC1 and FC3, and the switch device SW5. On the other hand, the output signal of the power amplifier 2 is input to the magenta head unit 42 through the switch device SW2, the flexible cable FC2 and FC4, and the switch device SW6. At this point, the time constant of the resistance component 2R of the flexible cable FC1 and FC3 and the flexible cable FC2 and FC4 that are connected in parallel and the capacitance component C/2 of the piezoelectric elements that are simultaneously driven is ½ as small as that of the flexible cable FC1 and FC2. Thus, the leading edges of the drive pulses that are output from the power amplifier to the piezoelectric elements do not delay. Consequently, a high print quality of an image can be maintained.

When the number of piezoelectric elements that are simultaneously driven is as small as one or two for each head unit, since the equivalent capacitance of piezoelectric elements applied as a load of each power amplifier is small, the time constant is small. Thus, small droplets driven to piezoelectric elements can be accurately sprayed to desired positions of print paper without delay.

With switch devices SW controlled corresponding to the number of piezoelectric elements that are simultaneously driven, power amplifiers and head units are connected through a plurality of cables. Thus, the time constant viewed from the power amplifiers can be decreased. Consequently, the drive capability of piezoelectric elements can be obtained as desired. Thus, an excellent print image with high print quality can be accomplished.

According to the present invention, since the total static capacitance of piezoelectric elements is distributed to a plurality of power amplifiers, even if the resistance of the transmission path does not vary, the time constant ô=RC is proportional to the static capacitance of the piezoelectric elements. Thus, the loss of the frequency component of the drive waveform signal due to RC on the transmission path decreases. Consequently, even if a plurality of piezoelectric elements is driven, output signals of the power amplifiers are input to the piezoelectric elements without deterioration. Thus, the piezoelectric elements can be effectively driven.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A piezoelectric element driving circuit for driving a plurality of piezoelectric elements disposed in a plurality of head units, comprising:

a plurality of power amplifiers for driving the plurality of piezoelectric elements disposed in the plurality of head units;

a plurality of first switch devices, disposed corresponding to said plurality of power amplifiers, having a plurality of connection/disconnection switches whose input side is short-circuited;

a plurality of flexible cables connected to the connection/disconnection switches of said plurality of first switch devices; and a plurality of second switch devices, disposed corresponding to said plurality of head units, having a plurality of connection/disconnection switches whose input side is connected to said plurality of flexible cables and whose output side is short-circuited and connected to the plurality of head units, wherein the output side of the connection/disconnection switches of said plurality of first switch devices and the input side of the connection/disconnection switches of said plurality of second switch devices are paired and connected, wherein the connection/disconnection of the connection/disconnection switches of said plurality of first switch devices and said plurality of second switch devices is controlled corresponding to the number of piezoelectric elements to be driven so as to decrease the time constant of said plurality of power amplifiers to a predetermined value or less.

2. The piezoelectric element driving circuit as set forth in claim 1, wherein the plurality of piezoelectric elements of the plurality of head units are vibrated so as to spray large ink droplets, middle ink droplets, or small ink droplets, and wherein when the small ink droplets are sprayed, the drive waveform signal is generated for a time constant that allows the number of piezoelectric elements that are simultaneously driven to become maximum.

3. The piezoelectric element driving circuit as set forth in claim 1, wherein the head units are a yellow head unit, a magenta head unit, a cyan head unit, and a black head unit that spray yellow ink, magenta ink, cyan ink, and black ink, respectively, wherein the head units spray large ink droplets, middle ink droplets, or small ink droplets of the individual colors corresponding to the number of piezoelectric elements of each of the head units connected to said plurality of power amplifiers and the level of the drive waveform signal, and wherein when the small ink droplets are sprayed, the drive waveform signal is generated for a time constant that allows the number of piezoelectric elements that are simultaneously driven to become maximum.

* * * * *